(12) United States Patent
Pepler et al.

(10) Patent No.: US 8,247,741 B2
(45) Date of Patent: Aug. 21, 2012

(54) DYNAMIC SYSTEM FOR VARIABLE HEATING OR COOLING OF LINEARLY CONVEYED SUBSTRATES

(75) Inventors: Kevin Michael Pepler, Denver, CO (US); James Joseph Jones, Arvada, CO (US); Sean Timothy Halloran, Denver, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 0 days.

(21) Appl. No.: 13/070,673

(22) Filed: Mar. 24, 2011

(65) Prior Publication Data

US 2012/0064657 A1 Mar. 15, 2012

(51) Int. Cl.
*F27B 9/06* (2006.01)
(52) U.S. Cl. .............. 219/388; 198/341.01; 198/341.08; 118/663; 118/666; 118/686; 118/708; 118/724; 219/121.28; 219/393; 219/395; 219/398; 219/413; 219/483; 219/518; 219/650; 219/653; 219/655; 257/E21.068; 257/E21.09; 257/E21.461; 257/E31.001; 438/57; 438/61
(58) Field of Classification Search .................. None
See application file for complete search history.

(56) References Cited

U.S. PATENT DOCUMENTS

| | | |
|---|---|---|
| 4,574,746 A | 3/1986 | Keyes, IV et al. |
| 5,248,349 A | 9/1993 | Foote et al. |
| 5,304,499 A | 4/1994 | Bonnet et al. |
| 5,366,764 A | 11/1994 | Sunthankar |
| 5,372,646 A | 12/1994 | Foote et al. |
| 5,470,397 A | 11/1995 | Foote et al. |
| 5,536,333 A | 7/1996 | Foote et al. |
| 5,712,187 A | 1/1998 | Li et al. |
| 5,994,642 A | 11/1999 | Higuchi et al. |
| 6,423,565 B1 | 7/2002 | Barth et al. |
| 6,444,043 B1 | 9/2002 | Gegenwart et al. |
| 6,719,848 B2 | 4/2004 | Faykosh et al. |
| 6,951,996 B2 | 10/2005 | Timans et al. |

(Continued)

FOREIGN PATENT DOCUMENTS

EP 0573749 12/1993

(Continued)

OTHER PUBLICATIONS

"PID Controller", 6 pages, Wikipedia, http://en.wikipedia.org/wiki/PID_controller.

*Primary Examiner* — Charles Garber
*Assistant Examiner* — Yasser Abdelaziez
(74) *Attorney, Agent, or Firm* — Dority & Manning, P.A.

(57) ABSTRACT

A system is provided for heating or cooling discrete, linearly conveyed substrates having a gap between a trailing edge of a first substrate and a leading edge of a following substrate in a conveyance direction. The system includes a chamber, and a conveyor operably configured within the chamber to move the substrates through at a conveyance rate. A plurality of individually controlled temperature control units, for example heating or cooling units, are disposed linearly within the chamber along the conveyance direction. A controller is in communication with the temperature control units and is configured to cycle output of the temperature control units from a steady-state temperature output as a function of the spatial position of the conveyed substrates within the chamber relative to the temperature control units so as to decrease temperature variances in the substrates caused by movement of the substrates through the chamber.

7 Claims, 6 Drawing Sheets

U.S. PATENT DOCUMENTS

| | | |
|---|---|---|
| 7,194,197 B1 | 3/2007 | Wendt et al. |
| 2002/0117199 A1 | 8/2002 | Oswald |
| 2003/0044539 A1 | 3/2003 | Oswald |
| 2006/0141135 A1 | 6/2006 | Wang et al. |
| 2008/0069550 A1 | 3/2008 | Timans et al. |
| 2009/0110824 A1* | 4/2009 | Takenaga et al. .......... 427/248.1 |
| 2009/0194165 A1 | 8/2009 | Murphy et al. |
| 2012/0042828 A1* | 2/2012 | Black ........................... 118/715 |

FOREIGN PATENT DOCUMENTS

| | | |
|---|---|---|
| EP | 0853345 A1 | 7/1998 |
| JP | 2005317730 | 11/2005 |

* cited by examiner

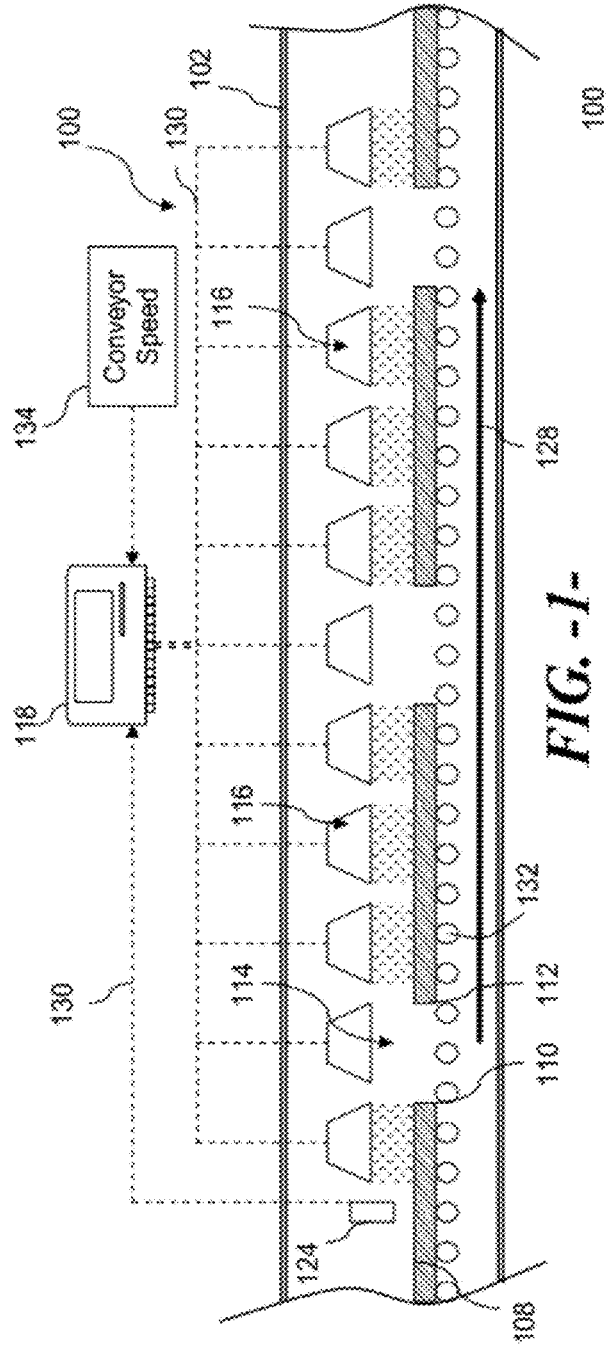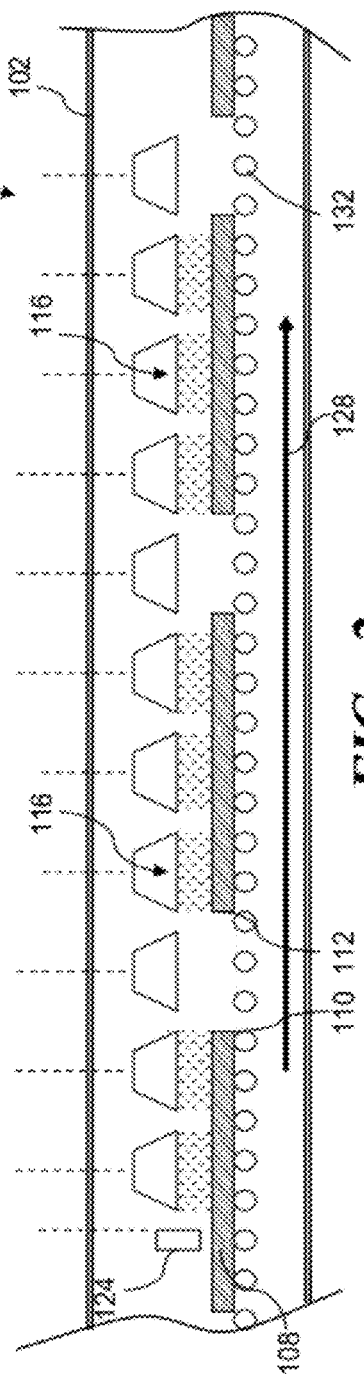

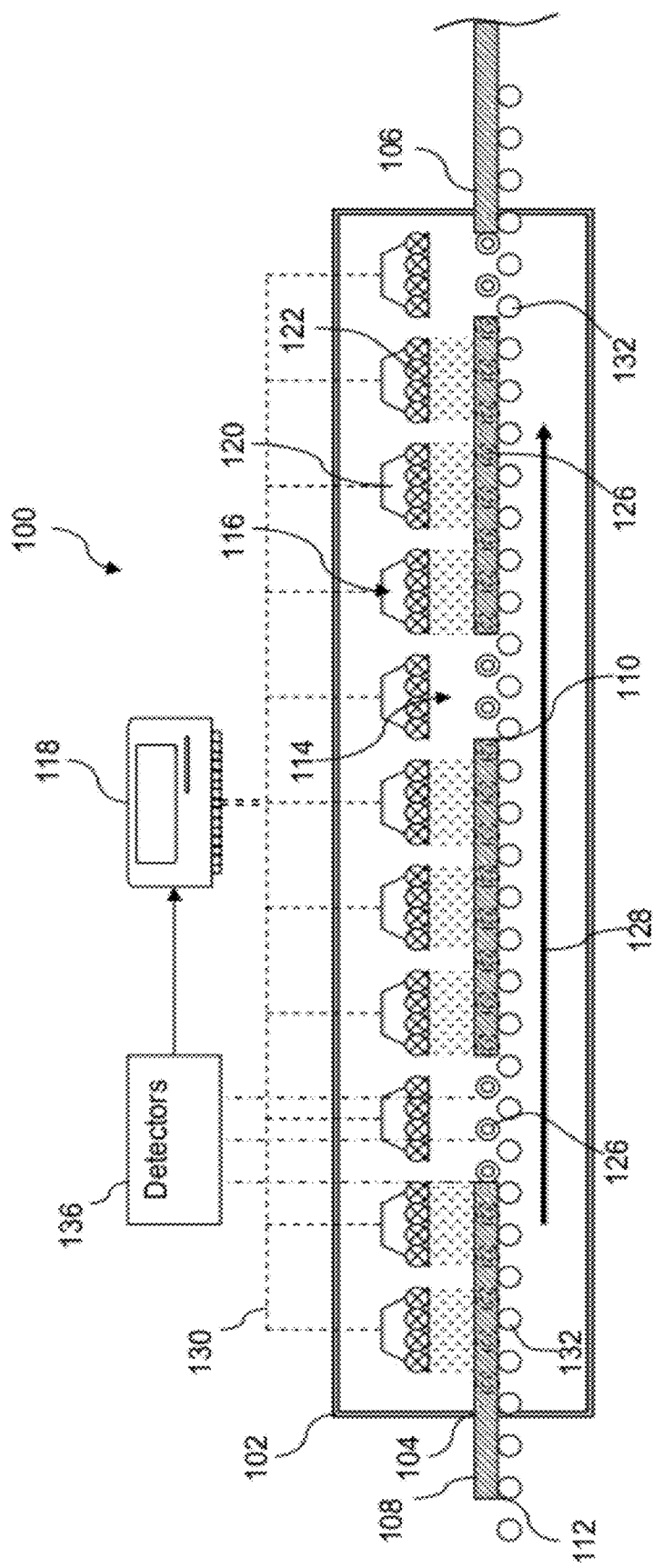
FIG. -3-

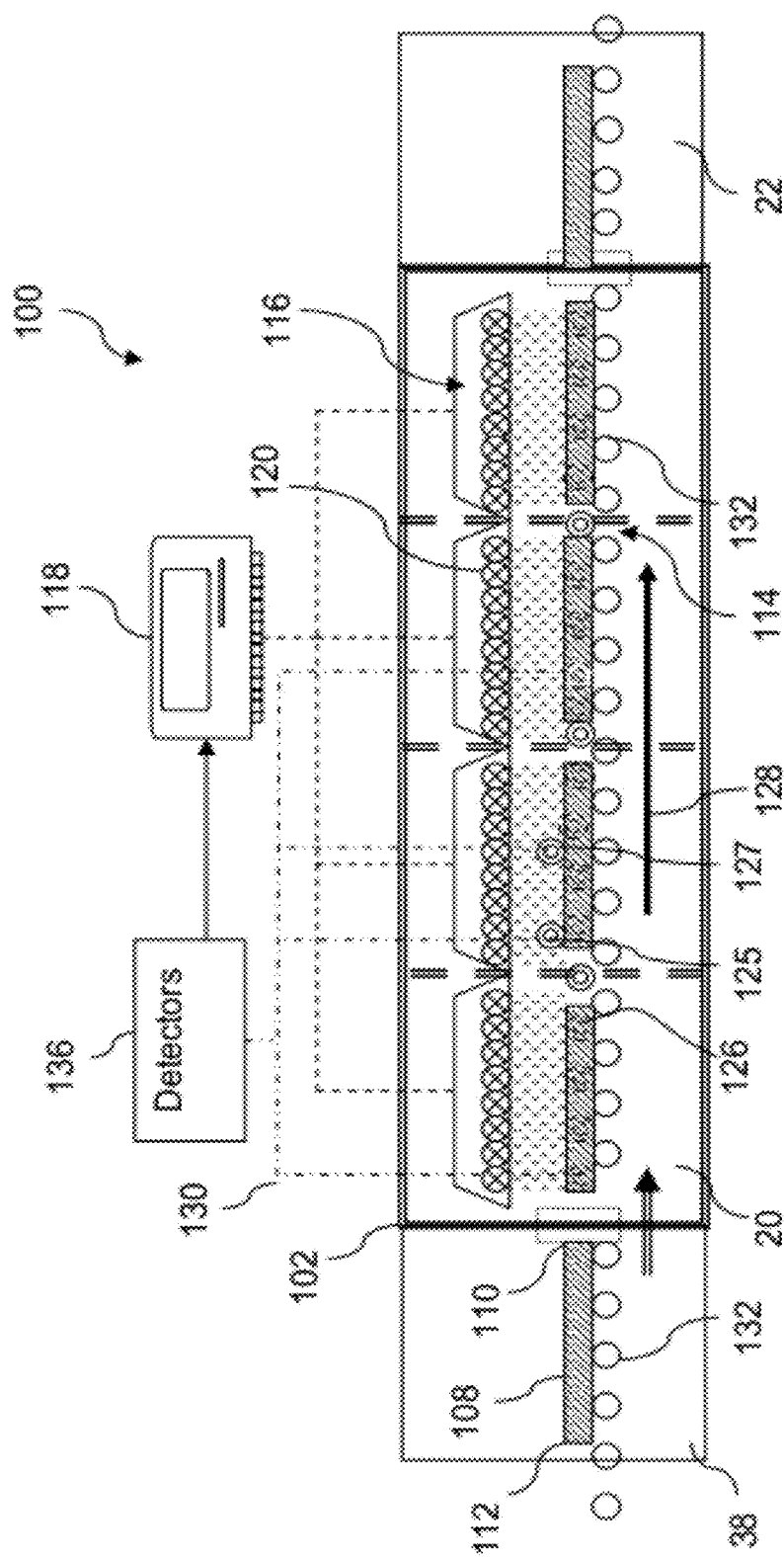
FIG. -4-

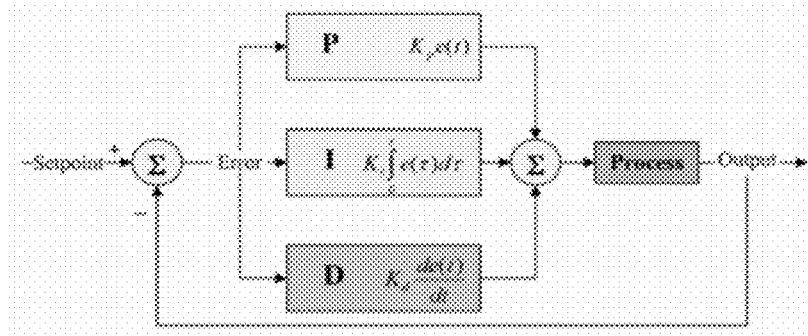

FIG. -5-

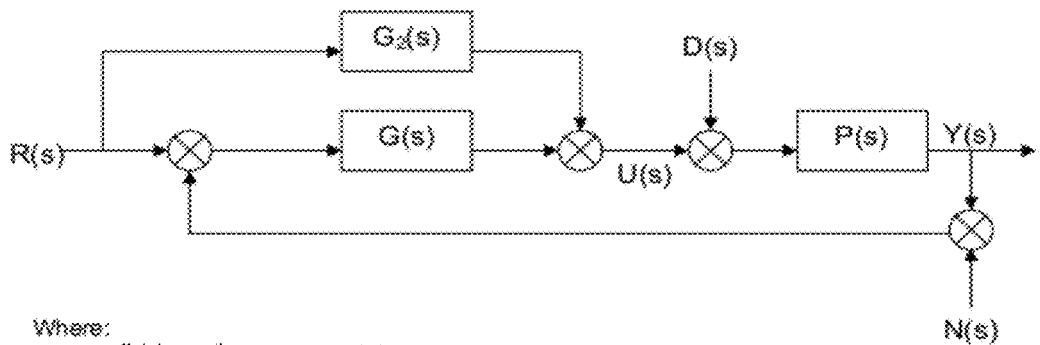

Where:
R(s) = reference setpoint temperature
U(s) = manipulated signal (i.e., MV)
D(s) = disturbance signal
Y(s) = output signal (i.e., PV)
N(s) = noise signal
B(s) = modified process variable (PV)
P(s) = plant process function; for a heater modeling process, function may be:
$$\frac{1}{LCs^2 + RCs + 1}$$
where the heater has inductance (L), capacitance (C), and resistance (R)

G(s) = standard PID transfer function
$G_2(s)$ = spatially modulated transfer function in a feed-forward architecture; for a ramp function triggered by spatial position of the substrate relative to heater, function may be:
$$K_{g2}(1/s^2)$$
where $K_{g2}$ is the ramp constant Where: Closed loop transfer function becomes:
$$\frac{Y(s)}{R(s)} = \frac{[G(s) + G2(s)]P(s)}{1 + G(s)P(s)}$$

FIG. -6-

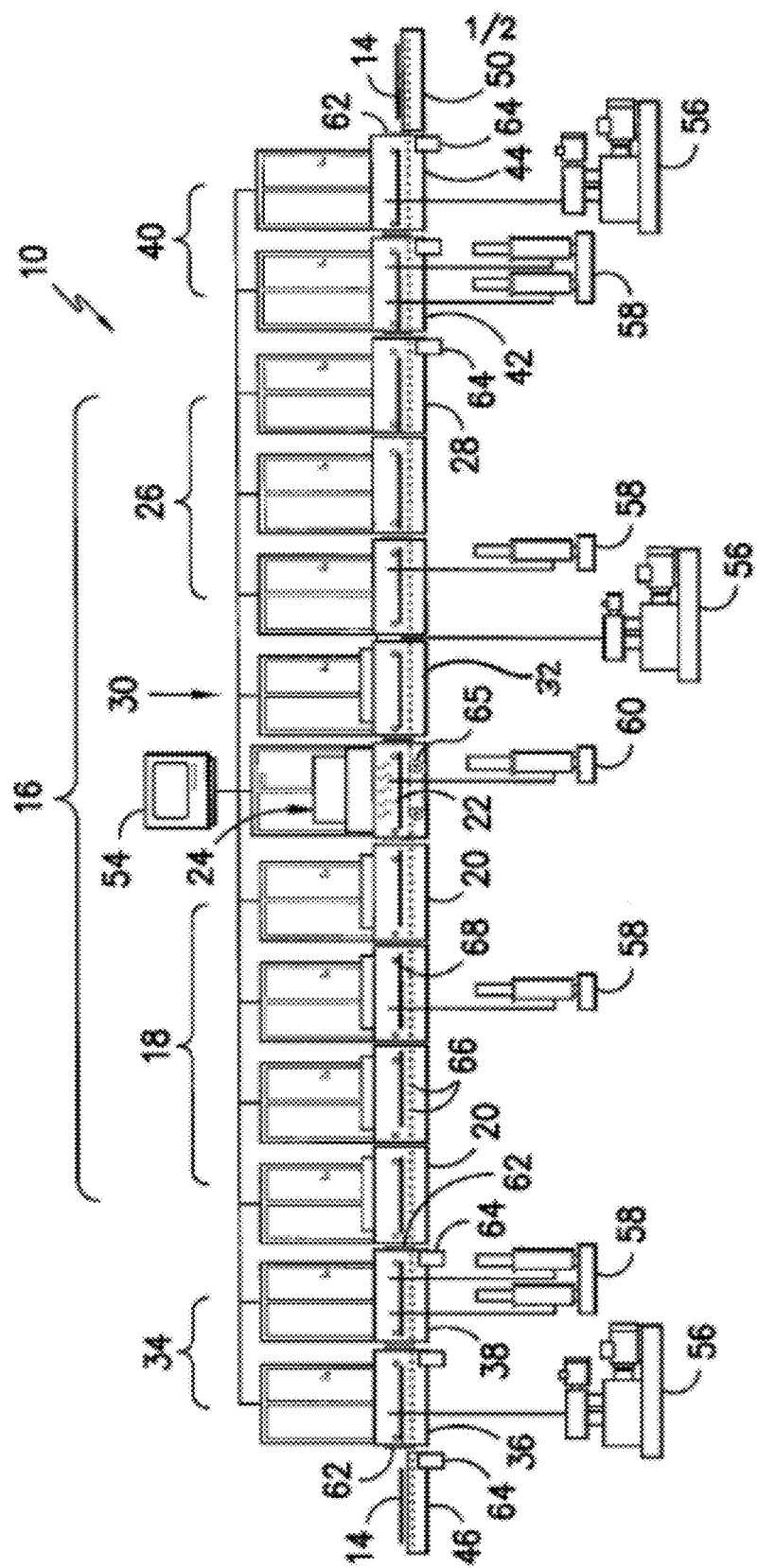
FIG. -7-

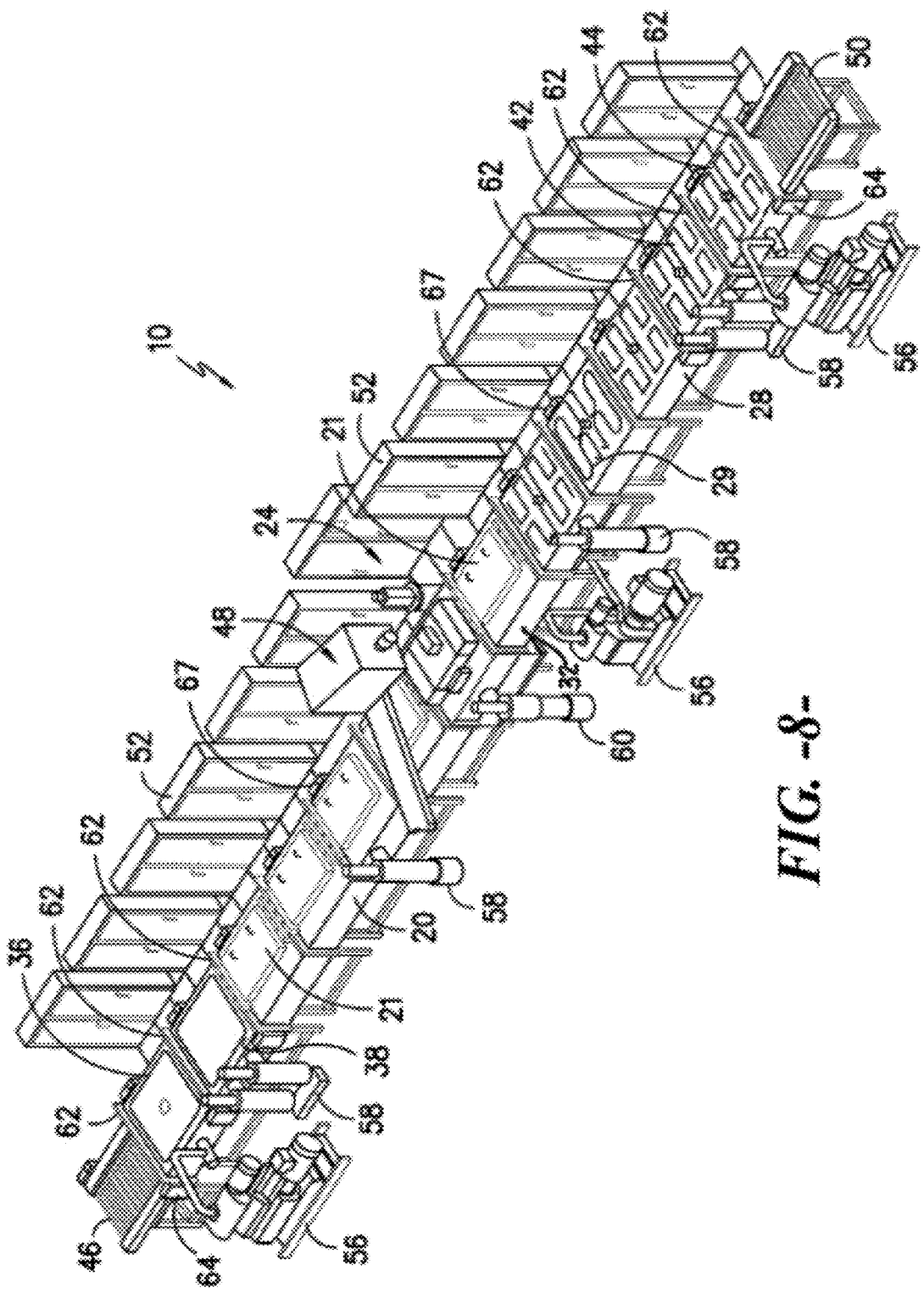
FIG. -8-

DYNAMIC SYSTEM FOR VARIABLE HEATING OR COOLING OF LINEARLY CONVEYED SUBSTRATES

FIELD OF THE INVENTION

The present subject matter relates generally to systems for heating components conveyed therethrough, and more particularly to systems for heating linearly conveyed substrates, such as glass substrates in the production of photovoltaic (PV) modules.

BACKGROUND OF THE INVENTION

Various manufacturing processes require controlled heating or cooling of components conveyed through a chamber with the intent of achieving a uniform temperature profile along the components. An example of such a process is the production of thin film photovoltaic (PV) modules ("panels") wherein individual glass substrates are conveyed linearly through a pre-heat stage prior to deposition of a thin film layer of a photo-reactive material onto the surface of the substrates. It is important to obtain uniform heating of the substrates prior to the deposition process. Non-uniform heating leads to processing problems, such as bowing of the substrates, non-uniform deposition of the film layer, inconsistent film performance properties, and the like, all of which adversely affect overall performance of the PV module.

A continuous linear flow of discrete substrates through a steady-state heating or cooling chamber is prone to producing temperature non-uniformities in the components. Such non-uniformities may be the result of a combination of factors, including gaps or spaces that exist between the components, moving the components past stationary heating or cooling elements, and non-uniform conveyance rates of the components. With respect to gaps between the components, because the edges of the components have a greater surface area as compared to the interior or center region of the component, the edge regions have a reduced thermal mass and will heat or cool quicker as they are conveyed past a steady-state heating or cooling element. Conventional steady-state heating or cooling chambers do not adequately compensate for these edge-induced temperature irregularities.

Another potential cause of temperature variances along the substrates is that, in certain systems, the substrates are rapidly conveyed into the heating chamber such that a negligible time differential is created between when the leading and trailing edges of the substrates begin to be heated. Thereafter, the substrates are conveyed at a relatively constant speed through the chamber. This results in an increasing temperature gradient along the length of the substrate as the substrate moves linearly out of the heat zone because the trailing edge portions remain in the heat zone longer than the leading edge portions.

Accordingly, there exists an ongoing need in the industry for an improved system and method for the uniform heating or cooling of discrete, linearly conveyed components, especially glass substrates conveyed through heating or cooling chambers during the production of PV modules.

BRIEF DESCRIPTION OF THE INVENTION

Aspects and advantages of the invention will be set forth in part in the following description, or may be obvious from the description, or may be learned through practice of the invention.

In accordance with an embodiment of the invention, a system is provided for variable heating or cooling of discrete linearly conveyed substrates having a leading and trailing edge. The system compensates for temperature variances that would otherwise be induced in the substrates from conveyance through a steady-state temperature chamber. The system includes a chamber, and a conveyor within the chamber to move the substrates through the chamber at a conveyance rate, which may be a constant rate. A plurality of individually controlled temperature control units are disposed within the chamber along the conveyance direction. The temperature control units may be heating units or cooling units. A controller is in communication with the temperature control units and is configured to cycle (i.e., decrease/increase or increase/decrease) output of one or more of the temperature control units from a steady-state temperature output as a function of the spatial position of the conveyed substrates within the chamber relative to the respective temperature control unit. In this way, temperature variances in the substrates that would otherwise be caused by movement of the substrates through a constant temperature in the chamber are reduced. It should thus be appreciated that the substrates are not heated at a constant, steady-state temperature as they are conveyed through the chamber.

In a particular embodiment of the system, the chamber comprises a plurality of aligned processing modules in a photovoltaic (PV) module manufacturing line, with each module having at least one temperature control unit. For example, the processing modules may define a pre-heat processing section in the PV manufacturing line and have a controllable heater unit in communication with the controller, whereby heat output of the heater units is cycled as a function of the spatial position of the substrates as they move through the processing modules. In a particular embodiment, a buffer module precedes the pre-heat processing section and the conveyor is configured to rapidly convey the substrates from the buffer module into a first one of the processing modules at a rapid conveyance rate, wherein the substrates are subsequently conveyed at a reduced constant conveyance rate through the remaining downstream modules. The controller is configured to cycle output of at least one of the processing modules as a function of the spatial position of the substrates relative to the module to compensate for a temperature gradient that would otherwise be induced by conveyance of the substrate out of the first processing module at the reduced constant conveyance rate.

A plurality of linearly spaced-apart edge detectors may be disposed in the chamber downstream of the first processing module and in communication with the controller to provide signals indicative of the actual spatial position of the substrate relative to the cycled processing modules. With this embodiment, the controller may be configured to decrease output of the cycled processing module upon detection of a leading edge of the substrate reaching a first one of the edge detectors, and to increase output of the module upon the leading edge reaching a downstream edge detector.

In an alternate embodiment, the controller may be configured to cycle output of the cycled processing module as a function of a calculated spatial position of the substrate relative to the module. This calculation may be based on the conveyance rate (pre-defined or measured) and known length of the substrates.

The invention also encompasses various method embodiments for heating or cooling discrete linearly conveyed substrates in a chamber to decrease temperature variances in the substrates. The method includes conveying the substrates at a conveyance rate linearly through a chamber having a plurality of temperature control units disposed therein along the conveyance direction. The output of the temperature control units is cycled from a steady-state temperature as a function of the actual or calculated spatial position of the substrates within the chamber relative to the respective temperature control units so as to decrease temperature variances in the substrates that would otherwise be caused by movement of the substrates through a steady-state temperature chamber. In certain embodiments, the output of the temperature control units is controlled by detecting the leading and trailing edges of the substrates relative to the temperature control units as the substrates are conveyed through the chamber. In other embodiments, the output of the temperature control units is controlled by calculating the spatial position of the leading and trailing edges of the substrates relative to the temperature control units, for example based on the conveyance rate and pre-defined length of the substrates.

In a system wherein the substrates are initially conveyed into the chamber at an rapid conveyance rate and thereafter conveyed through the chamber at a constant conveyance rate, the method may include cycling the output of at least one of the temperature control units as a function of the spatial position of the substrates relative to the units to compensate for a potential temperature gradient that would otherwise be induced by conveyance of the substrates at the constant conveyance rate after the initial rapid conveyance into the chamber.

The method may include conveying the substrates through the chamber with a gap between the leading edge and trailing edge of adjacent substrates, and sequentially cycling the output of the temperature control units as a function of the actual or calculated spatial position of the leading and trailing edges of the substrates within the chamber to decrease edge-induced temperature variances that would otherwise be caused by movement of the substrates through a steady-state temperature chamber.

The method may be used for control of a vacuum chamber in a photovoltaic (PV) module manufacturing line wherein the temperature control units are individually controlled heater units disposed in a pre-heat section of the vacuum chamber, or cooling units disposed in a cool-down section of the chamber.

Variations and modifications to the embodiments of the system assembly discussed above are within the scope and spirit of the invention and may be further described herein.

These and other features, aspects and advantages of the present invention will become better understood with reference to the following description and appended claims.

BRIEF DESCRIPTION OF THE DRAWINGS

A full and enabling disclosure of the present invention, including the best mode thereof, is set forth in the specification, which makes reference to the appended drawings, in which:

FIG. 1 is a side plan view of an embodiment of a system in accordance with aspects of the invention;

FIG. 2 is a side plan view of the embodiment of FIG. 1 illustrating advancement of the substrates through the system;

FIG. 3 is a side plan view of another embodiment of a system in accordance with aspects of the invention;

FIG. 4 is a side plan view of still a different embodiment of a system in accordance with aspects of the invention;

FIG. 5 is a block diagram of a conventional PID controller;

FIG. 6 is a block diagram and associated legend of a PID control loop modified with a spatial modulated function to account for relative spatial location of substrates within a temperature processing chamber;

FIG. 7 is a side plane view of a photovoltaic (PV) manufacturing system incorporating aspects of the present invention; and, FIG. 8 is a perspective view of the system of FIG. 7.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIGS. 1 and 2 illustrate an exemplary embodiment of a system 100 for heating or cooling discrete substrates 108 that are conveyed linearly through a chamber 102. The substrates 108 have a leading edge 110 and a trailing edge 112 in a conveyance direction 128 through the chamber 102. It should be appreciated that the invention is not limited to any particular type of substrate 108 and has utility in any manufacturing or processing application wherein it is desired to obtain a uniform temperature profile along discrete, linearly conveyed articles. As described in more detail below, the invention is particularly well suited for processing glass substrates in a PV module manufacturing system.

The substrates 108 are conveyed through the chamber 102 by any manner of suitable conveyor 132, such as a roller conveyor, belt conveyor, chain conveyor, a combination of discrete conveyors, and so forth. The conveyor is desirably controlled to convey the substrates 108 at a relatively constant conveyance rate through the chamber 102. However, the present system 100 may also accommodate varying conveyance rates, including stepped conveyance.

The chamber 102 is also not a limiting factor of the invention, and may be any manner of enclosure that is suited for temperature-change processing of substrates 108. The chamber 102 may be a single structure, as depicted in FIGS. 1 through 3, or may be defined by a plurality of structures or modules that are adjacently aligned in the conveyance direction of the substrates 108, as described below with reference to the embodiment of FIG. 4.

The substrates 108 are spaced apart on the conveyor 132 such that a gap 114 is defined between the trailing edge 112 of a first substrate 108 and the leading edge 110 of the following substrate 108. Desirably, this gap 114 is uniform along the plurality of substrates 108, although the system can be configured to accommodate gaps 114 of varying spacing.

A plurality of temperature control units 116 are disposed linearly within the chamber 102 along the conveyance direction 128. These units 116 are disposed generally across the width of the chamber 102 and are spaced so as to apply a relatively uniform temperature treatment to the substrates 108 as they advance through the chamber 102. The units 116 may be disposed over the substrates 108, as depicted in FIGS. 1 through 3, or below the substrates, for example if the substrates 108 are conveyed by an overhead conveyor 132. The type of temperature control units 116 will depend on the function of the system 100. In a particular embodiment, the system 100 is designed to heat the substrates and the units 116 are heater units 120 that contain one or more heater elements

122 (FIG. 3). The heater elements 122 may be any type or combination of conventional heating elements, including resistive heaters, quartz lamps, electron beam heaters, lasers, and so forth. Faster response heating elements, such as quartz lamps, may be more useful with greater conveyance rates of the substrates 108 through the chamber 102.

In an embodiment wherein the system 100 is designed to apply a controlled forced-cooling to the substrates 108, the temperature control units 116 may be any configuration of conventional cooling elements, including recirculating refrigerant systems, gas systems, forced air systems, and the like. It should be appreciated that the heater elements 122 may also be applied during a cooling process to control the rate of cooling of the substrates.

The temperature control units 116 are individually controlled so that their output can be cycled down and back up (or up and back down) as a function of the relative position of the substrates 108 within the chamber 102. The "cycling" of the units 116 may include simply turning the units on and off, as well as any other relative decrease and increase of the output of the units 116 (including phase angle or modulated/envelope control).

A controller 118 is in communication with each of the temperature control units 116 (via transmission lines 130) to sequentially vary the output of the units 116 along the conveyance direction 128 as a function of the spatial position of the substrates 108 relative to the heater control units, which may be determined by the position of the edges 112, 110 of the substrates 108. In other words, the controller 118 cycles the units in synchronism with movement of the edges 112, 110 (gaps 114) through the chamber 102. As a gap 114 passes through the effective temperature zone of a temperature control unit 116, the unit is cycled down (e.g., reduced output or shut off). As the gap 114 passes beyond the temperature zone, the unit 116 is cycled back up.

It should be appreciated that the term "controller" 118 is used generically to encompass any manner of hardware and software configuration to achieve the desired functions described herein. For example, the controller 118 may encompass a central system controller that is in communication with individual sub-controllers associated with each respective temperature control unit 116, and so forth.

FIGS. 1 and 2 depict essentially the same chamber 102 at different sequential times. In FIG. 1, the substrates 108 are at a relative position within the chamber 102 and the temperature control units 116 above the spaced apart edges 112, 110 (gaps 114) are powered down (as indicated by the lack of shading below certain units 116). In FIG. 2, the substrates 108 have advanced further through the chamber 102 and units 116 that were previously powered down have been cycled back up while adjacent units 116 (in the conveyance direction 128) are cycled down. This sequential cycling of the units 116 is coordinated with movement of the gaps 114 through the chamber 102.

It should thus be appreciated that the leading 110 and trailing 112 edge regions of the substrates 108 are exposed to a lesser degree of the temperature-changing effects of the temperature control units 116, which compensates for the relatively faster heating/cooling of the edge regions due to the thermal mass variations along the edges. A more "flattened" and uniform linear temperature profile is achieved for the substrates 108 as they are advanced through the chamber 102.

Control of the temperature control units 116 may be configured in various ways. For example, in one embodiment depicted for example in FIG. 1, the controller 118 cycles the units 116 as a function of a calculated position of the substrate edges 112, 110 as the substrates 108 move through the chamber 102. For example, an active or passive edge detector 124 may be disposed at a location within the chamber 102 to detect the leading 110 and trailing 112 edges as the substrates move into the chamber 102. With edge signals provided by the detector 124, the controller may calculate an actual width dimension (spacing) for the gap 114. Alternatively, the controller may be provided with a pre-defined gap width value. The controller 118 may also receive a conveyor speed signal 134 from an actual speed monitor or pre-defined speed input variable. Alternatively, with a pre-defined gap width, the conveyor speed may be calculated with inputs from the edge detector 124. Based on the gap width and conveyance speed, the controller can accurately calculate the position of the gaps 114 as the edges 112, 110 move through the chamber 102 and, thus, control the temperature units 116 as a function of the calculated edge positions. In this embodiment, an actual conveyor speed signal 134 would compensate for variances in conveyor speed.

In an alternate embodiment depicted for example in FIG. 3, the controller 118 is configured to cycle the temperature control units 116 as a function of detected actual positions of the edges 112, 110 as the substrates 108 move through the chamber 102. With this embodiment, a plurality of edge detectors 126 may be disposed linearly within the chamber 102 at a relative position to detect the presence or absence of the substrates 108, and thus the presence of gaps 114 between the substrates 108. The detectors 126 provide signals 136 to the controller 118. For example, the detectors 126 may be active transmitters/receivers disposed along a wall of the chamber 102 at a level that lies essentially in the conveyance plane of the substrates 108. The presence of a gap 114 (absence of a substrate) allows transmission of an active signal across the conveyor, and the absence or receipt of this signal indicates the presence of a gap 114. Thus, the sequential activation/deactivation of the detectors 126 provides an actual indication of movement of the substrate edges 112, 110 through the chamber 102.

It should be appreciated that the detectors 126 may be any manner of active transmitter/receiver, including infra-red, radio frequency, laser, and other active devices that can withstand the operating environment of the chamber 102. The detectors 126 may be a single transmitter/receiver unit that detects the signal reflected from the side edges of the substrates (108), or may have a remote receiver that detects the signal that passes through the gaps 114. It should also be understood that the detectors may be positioned above or below the substrates 108 in alternate embodiments.

The detectors 126 may also be passive contact devices. For example, the detectors 126 may include a biased tab and be disposed along a wall of the chamber 102 so that the taps engage against the side edges of the substrates 108. Deflection of the tabs into a gap 114 will produce a corresponding signal that is received by the controller 118.

FIG. 3 also depicts each temperature control unit 116 as including a plurality of individual elements 122, for example individual heater elements. These elements 122 may be operated as a common group within any given unit 116, or may be individually controlled within the unit 116 to provide even more refined temperature control within any given temperature zone.

FIG. 4 depicts an embodiment of a system 100 wherein the chamber 102 is divided into a plurality of adjacently aligned modules. The modules may be, for example, pre-heat modules 20 that precede a vapor deposition module 22 in a vacuum chamber of PV module manufacturing line, as discussed in greater detail below with reference to FIGS. 7 and 8. The temperature control unit 116 associated with each module 20 may include one or more independently controlled heater units 120 that increase the temperature of the substrates to a level sufficient for vapor deposition of a thin film layer of semiconductor thereon in the vapor deposition module 22.

The substrates 108 are conveyed via conveyor 132 into the first module 20 from a buffer station/module 38 once pressure between the module 38 and module 20 is equalized and are subsequently conveyed through the modules 20 at a relatively constant conveyance rate. Once the initial position in the first module 20 is "clear", the next subsequent substrate 108 in the buffer module 38 is rapidly conveyed ("indexed") into the first module 20 at a conveyance rate that is significantly greater than the constant conveyance rate of the substrates 108 through the modules 20. In essence, the initial conveyance rate of the substrates 108 into the first module 20 may be considered "instantaneous" in that little to no significant heating differential between the leading 110 and trailing 112 edges of the substrate results. Once the substrate 108 has been rapidly indexed into the first module 20, it is then conveyed at the constant conveyance rate of the other substrates 108 with a gap 114 between its leading edge 110 and the trailing edge 112 of the adjacent upstream substrate 108.

Still referring to FIG. 4, it should thus be appreciated that as the substrates 108 move through the modules 20 and are progressively heated before being conveyed into the vapor deposition module 22, the trailing edge portion of each substrate spends more time in the modules 20 as compared to the leading edge portion. This will result in an increasing temperature gradient being induced lengthwise in the substrates (in the direction of conveyance). In other words, in the vapor deposition module 22, the trailing edge portion of the substrate 108 will be at a greater temperature than the leading edge portion, which is detrimental to a uniform deposition of the thin film layer on the surface of the substrate 108.

The system 100 may also be designed to compensate for the conveyance-induced temperature variance discussed above by decreasing the heat output of one or more of the heater units 120 as a function of the spatial position of the substrate within the chamber relative to the unit 120 so that less heat is transferred to the trailing edge portion as compared to the leading edge. For example, referring to the embodiment of FIG. 4, an edge detector 125 is disposed at a first location within the chamber 102 to detect the leading edge 110 of the substrate 108 being conveyed from the first module 20. At this detection, the controller 118 may reduce the output of the heater units 120 in the first module 20 (individually or as a group) by a set amount (e.g. % reduction of the steady-state output), or even turn-off the units 120, while the trailing edge portion of the substrate is conveyed through the first module 20. In this manner, the trailing edge portion is heated to a lesser degree. When the leading edge 110 reaches the downstream edge detector 127, output of the heater units 120 is returned to their steady-state condition. Thus, by cycling the output of the heater units 120 as a function of the spatial position of the substrate 108 relative to the units, the temperature gradient that would otherwise be produced in the substrate is compensated for.

It should be appreciated that the compensation process need not occur in the first module 20. The process may also be accomplished in any one or combination of the other modules 20, with the goal being to achieve a uniform linear temperature profile in the substrates 108 prior to conveyance into the vapor deposition chamber 22. For example, the process may be implemented in the first module 20 and the next adjacent module 20, and so forth.

In the embodiment of FIG. 4, the compensation process in controlled by detection of the actual position of the substrates 108 relative to the cycled heater units 120 (via the edge detectors 125, 127). In alternate embodiments, the controller 118 may be configured to calculate the spatial position based on, for example, defined conveyance rate, spacing between substrates, substrate length, and so forth.

FIG. 4 depicts additional edge detectors 126 that may function with the controller 118 in accordance with the processes discussed above related to decreasing edge-induced temperature variances in the substrates. The different compensation processes may be implemented concurrently in the chamber 102.

Control of the temperature control units 116 may be accomplished in various ways. In a particular embodiment, the controller 118 may utilize a PID (Proportional Integral Derivative) control algorithm that is modulated as a function of spatial location and rate of speed of the substrates 108 through the processing chamber relative to the temperature control units 116 to achieve any one or combination of the temperature compensation processes described herein. A PID controller is a generic control loop feedback mechanism that is widely used in processing applications to calculate an "error" as the difference between a measured process value (PV) (e.g., temperature) and a desired setpoint value (SP). The controller attempts to minimize the error by adjusting the process control inputs. PID controllers are commonly used for temperature control in various manufacturing applications.

FIG. 5 is a block diagram of a PID control algorithm, which is well known and need not be explained in detail herein. Generally, the PID control algorithm involves three separate parameters: the proportional (P), the integral (I), and the derivative (D) values. These values are combined to provide a manipulated variable (MV (t)) output from the PID controller as a function of time. In the time realm, the proportional (P) value (also called "gain") makes a change to the output (MV) that is proportional to the current error value (e(t)) between the setpoint (SP) and process (PV) values multiplied by a tunable proportional gain factor $K_p$:

$$P_{out} = K_p e(t)$$

The integral (I) value (also called "reset") makes a change to the output (MV) that is proportional to the magnitude and duration of the error by integrating the error over time and multiplying the value by a tunable integral gain factor $$I_{out} = K_i \int_0^t e(\tau) d\tau$$

The integral (I) term accelerates process towards the setpoint and eliminates the inherent steady-state error that occurs with proportional-only controllers.

The derivative (D) value (also called "rate") makes a change to the output (MV) as a function of the slope of the error over time multiplied by a tunable derivative gain factor $K_d$:

$$D_{out} = K_d \frac{d}{dt} e(t)$$

The derivative (D) term slows the rate of change of the controller output and reduces the magnitude of the overshoot produced by the integral (I) term.

The proportional (P), integral (I), and derivative (D) terms are summed to calculate the output (u(t)) of the PID controller:

$$u(t) = MV(t) = K_V e(t) + K_i \int_0^k e(T) dT + K_d \frac{d}{dt} e(t)$$

The control loop is "tuned" to the specific requirements of the process by adjustment of the different gain values (Kp, Ki, Kd) to achieve an optimum control response. Various known methods exist for this "loop tuning"

FIG. 6 is a block diagram (with legend) of a feedback control loop that may be implemented in a system for heating or cooling substrates conveyed through a processing chamber, wherein the temperature control units 116 are controlled as discussed above to compensate for edge-induced temperature variances or conveyance variances (FIG. 4). In the particular embodiment depicted in FIG. 6, a standard PID controller is modulated to accommodate varying temperature setpoints over time as a function of the spatial position of the substrates relative to the units 116. As explained in the legend provided with the block diagram in FIG. 6, the standard PID transfer function G(s) is modified with a spatially modulated transfer function $G_2(s)$ that is triggered by the relative position of the substrates 108 within the processing chamber 102, which may be detected by any combination of edge detectors 124-127 in communication with the controller 118. The spatially modulated transfer function $G_2(s)$ may be, for example, a ramp function that, when triggered, combines with the output of the PID transfer function G(s) to change the manipulated signal U(s) to decrease/increase the output of the temperature control units 116 (e.g., a defined % decrease and subsequent increase) when the edges 112, 110 of adjacent substrates 108 are passing below the units 116, as discussed above.

It should be appreciated that the invention is not limited to any particular type of feedback control, and that the modulated PID control algorithm described herein is for exemplary purposes.

FIGS. 7 and 8 illustrate an embodiment of a vapor deposition system 10 configured for vapor deposition of a thin film layer (generally less than about 10 microns (μm)) on PV module substrates 14 that are conveyed through the system 10. The thin film may be, for example, a film layer of cadmium telluride (CdTe). As described in greater detail below, the system 10 may incorporate one or more of the temperature control chambers 102 in accordance with aspects of the invention.

The system 10 includes a vacuum chamber 16, which may be defined by any configuration of components. In the particular illustrated embodiment, the vacuum chamber 16 is defined by a plurality of interconnected modules, as discussed in greater detail below. In general, the vacuum chamber 16 may be considered as the section or portion of the system 10 wherein a vacuum is drawn and maintained for the various aspects of the vapor deposition process.

The system 10 includes a pre-heat section 18 within the vacuum chamber 16. The pre-heat section 18 may be one or a plurality of components that preheat the substrates 14 as they are conveyed through the vacuum chamber 16. In the illustrated embodiment, the preheat section 18 is defined by a plurality of interconnected modules 20 that define a heated conveyance path for the substrates 14 through the vacuum chamber 16. Each of the modules 20 may include a plurality of independently controlled heaters 21, with the heaters 21 defining a plurality of different heat zones. A particular heat zone may include more than one heater 21, and the heaters 21 may include multiple independently controlled heater elements, as discussed above with respect to FIG. 3. The pre-heat section 18 is controlled as described above such that the heaters 21 are cycled down and up as a function of the relative position of gaps between the substrates 14 that are conveyed through the preheat section.

Each of the preheat modules 20 also includes an independently controlled conveyor 66. The heaters 21 and conveyors 66 are controlled for each module 20 so as to achieve a conveyance rate of the substrates 14 through the preheat section 18 that ensures a desired temperature of the substrates 14 prior to conveyance of the substrates 14 into a downstream vapor deposition module 22.

The vacuum chamber 16 also includes a vapor deposition apparatus 24 downstream of the preheat section 18 in the direction of conveyance of the substrates 14. This apparatus 24 may be configured as a vapor deposition module 22 and is the component configuration wherein a source material, such as granular CdTe material, is sublimated and deposited onto the substrate 14 as a thin film layer. It should be readily appreciated that various vapor deposition systems and processes are known in the art, such as the CSS systems discussed above, and that the vapor deposition apparatus 24 is not limited to any particular type of vapor deposition system or process.

The vacuum chamber 16 also includes a cool-down section 26 downstream of the vapor deposition apparatus 24. In the illustrated embodiment, the cool-down section 26 is defined by a plurality of interconnected cool-down modules 28 through which the substrates 14 are conveyed prior to being removed from the system 10. The cool-down modules 28 define a longitudinally extending section within the vacuum chamber 16 in which the substrates having the thin film of sublimed source material deposited thereon are allowed to cool at a controlled cool-down rate prior to the substrates 14 being removed from the system 10. The cool-down modules 28 having independently controlled conveyors 66. Each module 28 may include one or more independently controlled cooling units 29, with the units 29 defining a plurality of different cooling zones. A particular cooling zone may include more than one cooling unit 29, and the units 29 may include multiple independently controlled cooling elements, as discussed above with respect to FIG. 3. The cool-down section 26 may be controlled as described above such that the cooling units 29 are cycled down and up as a function of the relative position of gaps between the substrates 14 or to compensate for conveyance-induced temperature variances.

The system 10 also includes a conveyor system that is operably disposed within the vacuum chamber 16. In the illustrated embodiment, this conveyor system 16 includes a plurality of individual conveyors 66, with each of the modules in the system 10 including a respective one of the conveyors 66. It should be appreciated that the type or configuration of the conveyors 66 is not a limiting factor of the invention. In the illustrated embodiment, the conveyors 66 are roller conveyors driven by a motor drive that is controlled so as to achieve a desired conveyance rate of the substrates 14 through a respective module, and the system 10 overall.

The system 10 also includes a feed system 48 (FIG. 8) that is configured with the vapor deposition apparatus 24 to supply the apparatus 24 with source material, such as granular CdTe material. The feed system 48 may take on various configurations within the scope and spirit of the invention, and functions so as to supply the source material without interrupting the continuous vapor deposition process within the vapor deposition apparatus 24 or conveyance of the substrates 14 through the vapor deposition apparatus 24.

The individual substrates 14 are initially placed onto a load conveyor 46, which may include, for example, the same type of driven roller conveyor 66 that is utilized in the other system modules. The substrates 14 are first conveyed through an entry vacuum lock station 34 that is upstream of the vacuum chamber 16. In the illustrated embodiment, the vacuum lock station 34 includes a load module 36 upstream of a buffer module 38 in the direction of conveyance of the substrates 14. A "rough" (i.e., initial) vacuum pump 56 is configured with the load module 36 to drawn an initial vacuum level, and a "fine" (i.e., high) vacuum pump 58 is configured with the buffer module 38 to increase the vacuum in the buffer module 38 to essentially the vacuum level within the vacuum chamber 16. Valves 62 (e.g., gate-type slit valves or rotary-type flapper valves) are operably disposed between the load conveyor 46 and the load module 36, between the load module 36 and the buffer module 38, and between the buffer module 38 and the vacuum chamber 16. These valves 62 are sequentially actuated by a motor or other type of actuating mechanism 64 in order to introduce the substrates 14 into the vacuum chamber 16 in a step-wise manner without adversely affecting the vacuum within the chamber 16.

Under normal operating conditions, an operational vacuum is maintained in the vacuum chamber 16 by way of any combination of vacuum pumps 58, 56, and 60. In order to introduce a substrate 14 into the vacuum chamber 16, the valve 62 between the load module 36 and buffer module 38 is initially closed and the load module is vented. The valve 62 between the buffer module 38 and first pre-heat module 20 is closed. The valve 62 between the load module 36 and load conveyor 46 is opened and the individual conveyors 66 in the respective modules are controlled so as to advance a substrate 14 into the load module 36. At this point, the first valve 62 is shut and the substrate 14 is isolated in the load module 36. The rough vacuum pump 56 then draws an initial vacuum in the load module 36. During this time, the fine vacuum pump 58 draws a vacuum in the buffer module 38. When the vacuum between the load module 36 and buffer module 38 are substantially equalized, the valve 62 between the modules is opened and the substrate 14 is moved into the buffer module 38. The valve 62 between the modules is closed and the fine vacuum pump 58 increases the vacuum in the buffer module 38 until it is substantially equalized with the adjacent pre-heat module 20. The valve 62 between the buffer module 38 and pre-heat module 20 is then opened and the substrate is moved into the pre-heat module 20. This process repeats for each substrate 14 conveyed into the vacuum chamber 16.

It should be appreciated from the above description that the substrates 14 within the vacuum chamber 16 will thus have a gap between adjacent substrates due to the loading process.

In the illustrated embodiment, the vapor deposition apparatus 24 includes a module 22 in which the substrates 14 are exposed to a vapor deposition environment wherein a thin film of sublimed source material, such as CdTe, is deposited onto the upper surface of the substrates 14. The individual substrates 14 are conveyed through the vapor deposition module 22 at a controlled constant linear speed. In other words, the substrates 14 are not stopped or held within the module 24, but move continuously through the module 22 at a controlled linear rate. The conveyance rate of the substrates 14 may be in the range of, for example, about 10 mm/sec to about 40 mm/sec. The linear speed may be briefly adjusted (e.g., less than 5 seconds in every minute) as a "catch-up" adjustment for the substrates. In a particular embodiment, this rate may be, for example, about 20 mm/sec. In this manner, the leading and trailing sections of the substrates 14 in the conveyance direction are exposed to the same vapor deposition conditions within the vapor deposition module 22. All regions of the top surface of the substrates 14 are exposed to the same vapor conditions so as to achieve a substantially uniform thickness of the thin film layer of sublimated source material on the upper surface of the substrates 14.

The vapor deposition module 22 includes a respective conveyor 65, which may be different from the conveyors 66 in the plurality of upstream and downstream modules. Conveyor 65 may be particularly configured to support the vapor deposition process within the module 22. In the embodiment illustrated, an endless slat conveyor 65 is configured within the module 22 for this purpose. It should be readily appreciated, however, that any other type of suitable conveyor may also be used.

The vapor deposition apparatus 24 is configured with a feed system 48 (FIG. 8) to continuously supply the apparatus 24 with source material in a manner so as not to interrupt the vapor deposition process or non-stop conveyance of the substrates 14 through the module 22. The feed system 48 is not a limiting factor of the invention, and any suitable feed system 48 may be devised to supply the source material into the module 22.

In the illustrated embodiment, a post-heat section 30 is defined within the vacuum chamber 16 immediately downstream of the vapor deposition module 22. This post-heat section 30 may be defined by one or more post-heat modules 32 having a heater unit 21 configured therewith. The heat unit 21 may include multiple independently controlled heat zones, with each zone having one or more heaters. As the leading section of a substrate 14 is conveyed out of the vapor deposition module 24, it moves into the post-heat module 32. The post-heat module 32 maintains a controlled heating profile of the substrate until the entire substrate is moved out of the vapor deposition module 22 to prevent damage to the substrate, such as warping or breaking caused by uncontrolled or drastic thermal stresses. If the leading section of the substrate 14 were allowed to cool at an excessive rate as it exited the module 22, a potentially damaging temperature gradient would be generated longitudinally along the substrate 14. This condition could result in the substrate breaking from thermal stress.

The post-heat section 30 may be controlled as described above such that the heaters 21 are cycled down and up as a function of the relative position of gaps between the substrates 14 as they advance through the post-heat section.

An exit vacuum lock station 40 is configured downstream of the cool-down section 26. This exit station 40 operates essentially in reverse of the entry vacuum lock station 34 described above. For example, the exit vacuum lock station 40 may include an exit buffer module 42 and a downstream exit lock module 44. Sequentially operated valves 62 are disposed between the buffer module 42 and the last one of the modules 28 in the cool-down section 26, between the exit buffer module 42 and the exit lock module 44, and between the exit lock module 44 and an exit conveyor 50. A fine vacuum pump 58 is configured with the exit buffer module 42, and a rough vacuum pump 56 is configured with the exit lock module 44. The pumps 58, 56, and valves 62 are sequentially operated (essentially in reverse of the entry lock station 34) to move the substrates 14 out of the vacuum chamber 16 in a step-wise fashion without loss of vacuum condition within the vacuum chamber 16.

As mentioned, in the embodiment illustrated, the system 10 is defined by a plurality of interconnected modules, with each of the modules serving a particular function. For control purposes, each of the individual modules may have an associated independent controller 52 configured therewith to control the individual functions of the respective module. The plurality of controllers 52 may, in turn, be in communication with a central system controller 54, as illustrated in FIG. 7. The central system controller 54 can monitor and control (via the independent controllers 52) the functions of any one of the modules so as to achieve an overall desired conveyance rate and processing of the substrates 14 through the system 10. The controllers 52 and 54 may alone or combination function as the controller 118 referenced above in FIGS. 1 through 4 to control the pre-heat section 18, post-heat section 30, and cool-down section 26 in accordance with the principles described herein.

Referring to FIG. 7, for independent control of the individual respective conveyor 66, each of the modules may include any manner of active or passive sensors 68 that detect the presence of the substrates 14 as they are conveyed through the module. The sensors 68 are in communication with the module controller 52, which is in turn in communication with the central controller 54. In this manner, the individual respective conveyor 66 may be controlled to ensure that a proper spacing between the substrates 14 is maintained and that the substrates 14 are conveyed at the desired constant conveyance rate through the vacuum chamber 16. The sensors 68 may also function as the detectors 126 described above with reference to the embodiment of FIG. 3.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system for variable heating or cooling of discrete linearly conveyed substrates that compensates for temperature variances in the substrates, said system comprising:
   a chamber;
   a conveyor within said chamber to move the substrates through said chamber at a conveyance rate, the substrates having a leading edge and a trailing edge relative to a conveyance direction through said chamber;
   a plurality of individually controlled temperature control units disposed within said chamber along the conveyance direction; and,
   a controller in communication with said temperature control units, said controller configured to cycle output of said temperature control units from a steady-state temperature output as a function of the spatial position of the conveyed substrates within said chamber relative to said temperature control units so as to decrease temperature variances in the substrates caused by movement of the substrates through said chamber.

2. The system as in claim 1, wherein said chamber comprises a plurality of aligned processing modules in a photovoltaic module manufacturing line through which the substrates are linearly conveyed, with each said module comprising at least one said temperature control unit.

3. The system as in claim 2, wherein said processing modules define a pre-heat processing section and comprise controllable heater units in communication with said controller, whereby heat output of said heater units is cycled as a function of the spatial position of the substrates as they move through said processing modules.

4. The system as in claim 3, further comprising a buffer module preceding said pre-heat processing section, said conveyor configured to rapidly convey the substrates from said buffer module into a first one of said processing modules at a rapid conveyance rate, wherein the substrates are subsequently conveyed at a reduced constant conveyance rate, said controller configured to cycle output of at least one of the processing modules as a function of the spatial position of the substrates relative to said processing module to compensate for conveyance of the substrate out of said first processing module at the reduced constant conveyance rate.

5. The system as in claim 4, further comprising a plurality of linearly spaced-apart edge detectors disposed in said chamber downstream of said first processing module, said edge detectors in communication with said controller to provide signals indicative of the actual spatial position of the substrate relative to said cycled processing module.

6. The system as in claim 5, wherein said controller is configured to decrease output of said cycled processing module upon detection of a leading edge of the substrate reaching a first one of said edge detectors, and to increase output of said cycled processing module upon the leading edge reaching a downstream edge detector.

7. The system as in claim 4, wherein said controller is configured to cycle output of said processing module as a function of a calculated spatial position of the substrate relative to said cycled processing module.

* * * * *